(12) United States Patent
Lippert et al.

(10) Patent No.: US 10,884,045 B2
(45) Date of Patent: Jan. 5, 2021

(54) TEST ARRANGEMENT AND TEST METHOD

(71) Applicant: Rohde & Schwarz GmbH & Co. KG, Munich (DE)

(72) Inventors: Benedikt Lippert, Munich (DE); Martin Peschke, Vaterstetten (DE); Alexander Stuka, Hengersberg (DE); Renate Mittermair, Munich (DE); Alexander Kunze, Munich (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 46 days.

(21) Appl. No.: 16/203,019

(22) Filed: Nov. 28, 2018

(65) Prior Publication Data

US 2019/0302159 A1    Oct. 3, 2019

(30) Foreign Application Priority Data

Mar. 29, 2018  (EP) ..................................... 18164950

(51) Int. Cl.
*G01R 27/26* (2006.01)
*G01R 1/067* (2006.01)
*H01P 1/24* (2006.01)
*H01P 3/02* (2006.01)
*G01R 35/00* (2006.01)

(52) U.S. Cl.
CPC ............. *G01R 27/26* (2013.01); *G01R 1/067* (2013.01); *G01R 35/005* (2013.01); *H01P 1/24* (2013.01); *H01P 3/026* (2013.01); *G01R 1/06772* (2013.01)

(58) Field of Classification Search
CPC ....... G01R 27/26; G01R 35/005; G01R 35/02
See application file for complete search history.

(56) References Cited

U.S. PATENT DOCUMENTS 4,433,298 A     2/1984 Palm
6,146,908 A *  11/2000 Falque ................ G03F 7/70425
                                                              438/11

(Continued)

FOREIGN PATENT DOCUMENTS

WO       2009036331 A1    3/2009

OTHER PUBLICATIONS

Extended Search Report from counterpart European Application No. 18164950.0, dated Oct. 10, 2018, 16 pp.

(Continued)

*Primary Examiner* — Dominic E Hawkins
(74) *Attorney, Agent, or Firm* — Shumaker & Sieffert, P.A.

(57) ABSTRACT

Device and method for analyzing a probe, in particular for analyzing a symmetrical, differential probe. A ground-based test signal is provided to a main signal line, wherein the main signal line is terminated by a predetermined impedance. Furthermore, at least one additional signal line is provided, wherein a further impedance is arranged between the additional signal line and the ground. Accordingly, a differential probe may measure a differential signal between the main signal line and the additional signal line. Hence, no grounded signal is provided to the probe. This measurement of the probe can be compared with a reference signal directly acquired on the main signal line. In this way, characteristic values such as impedance and/or frequency response of the probe can be determined.

14 Claims, 4 Drawing Sheets

(56) References Cited

U.S. PATENT DOCUMENTS

| | | | | |
|---|---|---|---|---|
| 7,180,314 B1* | 2/2007 | Sekel | ............... | G01R 1/06766 324/130 |
| 9,618,599 B2 | 4/2017 | Dascher | | |
| 2008/0001611 A1* | 1/2008 | Convers | ............ | G01R 1/06766 324/754.07 |
| 2008/0048673 A1* | 2/2008 | Tan | .................. | G01R 1/06772 324/601 |
| 2011/0181361 A1* | 7/2011 | Nolan | ...................... | H03F 1/30 330/278 |
| 2012/0287792 A1* | 11/2012 | Nickel | .............. | G01R 1/06772 370/241 |
| 2014/0239994 A1* | 8/2014 | Alves Moreira | ........................... | G01R 31/31905 324/754.03 |

OTHER PUBLICATIONS

Spirito et al., "A calibration procedure for on-wafer differential load-pull measurements," 61st ARFTG Conference Digest, Spring 2003, IEEE, Jun. 13, 2003, 4 pp.

"P7350SMA 5 GHz Differential Probe," Tektronix: Instruction Manual, Retrieved Sep. 17, 2018 from: download.tek.comjmanual/071126401.pdf, Nov. 18, 2004, 89 pp.

"THS452x Very Low Power, Negative Rail Input, Rail-To-Rail Output, Fully Differential Amplifier," Texas Instruments, Retrieved Sep. 17, 2018 from: http://www.tij.co.jp/jp/lit/ds/symlink/ths4521.pdf, Jun. 1, 2015, 65 pp.

"IEEE Standard for Terminology and Test Methods for Circuit Probes IEEE Std 1696-2013," IEEE Standards Association, Feb. 14, 2014, 64 pp.

\* cited by examiner

TEST ARRANGEMENT AND TEST METHOD

TECHNICAL FIELD

The present invention relates to a test device and a test method. In particular, the present invention relates to a device and a method for analyzing a probe, especially a symmetrical of differential probe.

TECHNICAL BACKGROUND

Although applicable in principle to any probe, the present invention and its underlying problem will be hereinafter described in combination with a symmetrical probe for measuring radio frequency signals.

When measuring electric signals in a device under test, a measurement probe may be used for electrically contacting a measurement point. Due to parasitic effects such as parasitic inductances or capacities, a frequency response of the measurement system using a measurement probe may be influenced. In order to consider and compensate such influences, it is necessary to analyze the characteristics of the measurement probe and to take into account these characteristics.

For characterizing a measurement probe, a well-known predefined signal may be applied, and a measurement signal acquired by the probe can be compared with the original signal. For this purpose, an asymmetric, ground-based signal may be provided.

However, the asymmetric test signal makes it difficult acquire appropriate measurements for characterizing symmetric or differential probes. In particular, a frequency response of a symmetric measurement probe may be different from a frequency response of an asymmetric signal.

SUMMARY OF THE INVENTION

Hence, there is a need for a test device and a test method for analyzing and characterizing a measurement probe, in particular a symmetric or differential measurement probe.

The present invention therefore provides a test device with the features of claim 1 and a test method with the features of claim 14.

According to a first aspect, it is provided:

A test device for analyzing a probe, in particular for analyzing a symmetric probe. The test device comprises a main signal line and at least one symmetrical signal line. The main signal line is connectable to a first terminal of the probe. The main signal line comprises a test signal source interface and a first impedance. The test signal source interface is electrically connected to a first end of the main signal line. The test signal source interface is adapted to receive a test signal. The first impedance is adapted to terminate a second end of the main signal line. The at least one symmetrical signal line is connectable to a second terminal of the probe. Each symmetrical signal line comprises a second impedance. The second impedance is adapted to terminate a first end of the respective symmetrical signal line.

According to a second aspect it is provided:

A method for analyzing a probe, in particular for analyzing a symmetrical or differential probe. The test method comprises a step of applying a ground referenced test signal to a main signal line. The main signal line is terminated by a first impedance. The test signal comprises a predetermined test impedance. The test method further comprises a step of measuring a first measurement signal. The first measurement signal is provided by a terminal which is electrically connected to the main signal line. The test method further comprises measuring a second measurement signal. The second measurement signal is measured by the probe to be analyzed. The first terminal of the probe is electrically connected to the main signal line and the second terminal of the probe is electrically connected to at least one symmetrical signal line. The at least one symmetrical signal line is terminated by a second impedance. Finally, the test method comprises a step of determining a characteristic value of the probe. The characteristic value of the probe is determined based on the first measurement signal and the second measurement signal.

The present invention is based on the fact that characterizing a differential or symmetrical probe by applying an asymmetric measurement configuration may lead to inaccurate results. Especially when one terminal of a probe is directly connected to a ground and the other terminal of the probe is provided with the test signal, such a configuration may only result in imprecise characteristics for specifying the probe. Hence, a setup of the probe based on such measurements and/or a compensation of the measurement results might not fully compensate the disturbances, in particular disturbances or by parasitic elements.

It is therefore an idea of the present invention to provide a configuration of a test arrangement and an appropriate test method which can take into account the above identified problems and achieve a more accurate analysis of the probe for determining characteristic properties of the probe. For this purpose, a test signal is provided to a first terminal of the measurement probe by a main signal line having a well-defined termination. At the same time, a further terminal of the measurement probe is also connected to a further signal line having a well-defined termination. In other words, none of the terminals of the probe is directly connected to a ground. In this way, the properties for providing the test signal to the probe can be improved. In particular, an appropriate configuration for providing a symmetric test signal to a differential or symmetric test probe can be achieved, even though only a single, ground-based test signal is provided to the respective configuration.

The test signal source provides the test signal with a predetermined source impedance. Accordingly, if a wired connection between the test signal source and the test device is used, the impedance of this wired connection is also adapted to this source impedance. For example, a coaxial cable may be used, having an appropriate impedance.

The main signal line as well as the at least one symmetrical signal line may be realized as an electrically conductive structure. In particular, the main signal line and the at least one symmetrical signal line may comprise at least a section which provides a contact element for electrically connecting a terminal of the probe. In this way, the terminals of the probe can be connected with the main signal line and the at least one symmetrical signal line. For example, first terminal of the probe can be electrically connected to the main signal line and a further terminal of the probe can be electrically connected to a symmetrical signal line. A ground-based test signal can be provided to the main signal line, for example, by means of the test signal source interface. The test signal source interface may comprise, for example, a terminal or a connector for electrically connecting the main signal line to a test signal generator. In particular, it may be possible to provide the test signal at a first end of the main signal line. Furthermore, the other end of the signal line may be terminated by a predetermined impedance. The impedance may be, for example, a resistor or another appropriate element for terminating the main signal line with a predetermined impedance.

Furthermore, the at least one symmetrical signal line is also terminated at least at one end by a second impedance. The second impedance may be, for example, a resistor or another appropriate element for providing a desired predetermined impedance. Hence, the at least one symmetrical signal line does not have a direct electrical connection to a ground. Moreover, the at least one symmetrical signal line as well as the main signal line are terminated by appropriate impedances. In this way, it is possible to provide a symmetric signal to the probe, by providing a ground-based test signal to the main signal line. It is understood, that the test device may also comprise a conductive structure which can be connected to a ground, in particular to a common ground which is also connected to a test signal generator for providing the test signal. Accordingly, the impedances for terminating the main signal line and the at least one symmetrical signal line may be connected at one end to the respective conductive structure which is connected to the ground, and the respective other end of the impedances are connected to either the main signal line or the symmetrical signal line.

Accordingly, it is possible to connect the probe to be characterized to the main signal line and at least one symmetrical signal line and comparing the measurement signal acquired in this configuration with the original test signal. Based on this comparison, it is possible to determine characteristics of the measurement probe, for example an impedance of the measurement probe and/or a frequency response of the measurement probe.

In this way, a precise characterization of the measurement probe can be achieved, in particular for symmetrical or differential measurement probes.

Further embodiments of the present invention are subject of the further sub-claims and the following description referring to the drawings.

In a possible embodiment, each symmetrical signal line further comprises a third impedance. The third impedance is adapted to terminate a second end of the respective symmetrical signal line. Accordingly, each symmetrical signal line is terminated at both ends with an appropriate impedance. As already mentioned above, the third impedance as well as the second impedance may be, for example a resistor or another appropriate element providing a desired impedance. In particular, one end of the impedance may be connected to the symmetrical signal line, and the other end of the respective impedance may be connected to a ground. In this way, the signal line is terminated at both ends for avoiding reflections or the like.

In a possible embodiment, a value of the second impedance corresponds to a value of the third impedance. Accordingly, each symmetrical signal line is terminated at both ends with same impedance.

In a possible embodiment, the test device comprises a test signal source. The test signal source may be adapted to generate a ground referenced test signal. The generated ground referenced test signal may be provided to the main signal line, for instance by the test signal source interface.

The test signal source may provide a test signal having predetermined characteristics such as amplitude, frequency, frequency range, wave form or the like. In particular, the test signal may comprise a pulse, a Dirac impulse, or any other appropriate test signal for characterizing the test probe.

In a possible embodiment, the ground referenced test signal may comprise a predetermined source impedance, i.e. the test signal is provided by the test signal source with a predetermined impedance. Further, the connection between the test signal source and the test device may be also adapted to this source impedance. By providing the test signal with predetermined source impedance, and preferably adapting the test device to the respective source impedance, disturbances such as reflections or the like can be avoided. In particular, the test signal source may be connected to the test device by means of an appropriate connection having adapted impedance. For example, a coaxial connector and/or a coaxial cable may be used for connecting a test signal source to the main signal line.

In a possible embodiment, a value of the predetermined source impedance corresponds to a value of the first impedance. Accordingly, the main signal line is terminated by an impedance corresponding to the impedance of the test signal provided by the test signal source. In this way, disturbances such as reflections or the like can be avoided.

In a possible embodiment, a value of the second impedance corresponds to a value of an impedance of a parallel connection of the predetermined source impedance and the first impedance. Accordingly, the impedance of the symmetrical signal line is adapted to the impedance of the main signal line. The value of the second impedance may be set in the above mentioned manner, if the symmetrical signal line is terminated by a single impedance. The determination of an impedance of two parallel impedances can be calculated according to any appropriate scheme. For example, a reciprocal value of the impedances of two parallel impedances may be calculated by the sum of the reciprocal values of the individual impedances which are arranged in parallel.

In a possible embodiment, the test device may comprise two symmetrical signal lines. The two symmetrical signal lines may be arranged on opposite sides of the main signal line. Accordingly, the main signal line is arranged between two parallel symmetrical signal lines. In this way, a symmetrical configuration can be provided. This makes it very easy to connect a symmetrical or differential probe to such a configuration.

In a possible embodiment, the test device may comprise a fastening device. The fastening device may be adapted to fasten the probe to the test device. For example, the fastening device may comprise one or more suspension elements for fastening the probe on the test device. For example, the fastening device may comprise a number of legs. In this case, each leg may be adapted to fasten a terminal of the probe to the main signal line or symmetrical signal line, respectively. However, it is understood, that any other appropriate fastening device for fastening the probe, in particular the individual terminals of the probe to the test device and for providing a mechanical fastening and an electrical connection of the terminals of the probe to the main signal line and the symmetrical signal line can be used.

In a possible embodiment, the test device may comprise a connector. The connector may be adapted to connect a measurement device to the main signal line. The connector may further be adapted to connect the measurement device to at least one symmetrical signal line or a ground of the test device. In this way, it is possible to connect the measurement device directly to the test device. Accordingly, the test signals can be directly measured by a measurement device. This ensures a reliable and undisturbed measurement of the test signals. For example, the connector may comprise a coaxial connector, or any other appropriate connector for connecting the test device with the measurement device.

In a possible embodiment, the test device may comprise a dielectric support substrate. In particular, the main signal line and the at least one symmetrical signal line may be arranged on the dielectric support substrate. For example, the dielectric support substrate may comprise a surface, wherein both, the main signal line as well as the at least one symmetrical signal are arranged on the same surface of the dielectric support substrate. The dielectric support substrate may be, for example a substrate such as substrate of a printed circuit board or the like. Furthermore, the dielectric support substrate may be also formed by a ceramic material or the like. However, it is understood, that any other appropriate material providing the desired properties may be also possible.

In a possible embodiment, the main signal line and the at least one symmetrical signal line may be arranged as coplanar conducting paths. For example, the main signal line and the symmetric signal lines may be arranged as printed circuits on a substrate. For example, the conductive structures may be formed by electrically conducting materials such as copper, gold or the like. Furthermore, any other appropriate electrically conducting material, in particular materials providing contact to the probe with good properties such as low contact resistance etc. may be used. Furthermore, it may be also possible to apply the electrically conductive structure by a first material, for example copper, silver or the like and to cover this structure by a further conductive material providing improved properties for a contact of the terminals of the probe. For example, the conductive structure may be covered by gold or the like. However, it is understood, that also any other appropriate material, in particular an appropriate metal of alloy may be used for realizing the conductive structure.

In a possible embodiment, the test device may comprise an analyzer. The analyzer may be adapted to receive a first measurement signal. The first measurement signal may be received from the main signal line. The analyzer may be further adapted to receive a second measurement signal measured by the probe. For this purpose, the probe may be connected to the main signal line and at least one symmetrical signal line. In particular, one terminal of the probe may be connected to the main signal line and another terminal of the probe may be connected to a symmetrical signal line. Further, the analyzer may be adapted to determine a characteristic value of the probe. The characteristic value of the probe may be determined based on the first measurement signal which is directly measured on the main signal line, and the second measurement signal which is acquired by means of the probe.

By comparing the original signal applied to the main signal line and the measurement signal acquired by means of the probe, characteristic values of the probe may be determined. In particular, the original signal may be compared with the signal acquired by means of the probe in order to determine a deviation of the signal when measuring the signal by means of the probe.

In a possible embodiment, the characteristic value of the probe may comprise at least one of an impedance of the probe, a frequency response of the probe, or any other appropriate characteristic property of the probe.

The analyzer may comprise, for example, a signal processor for processing the received measurement signals. In particular, the analyzer may comprise additional elements like analog-to-digital converters, digital-to-analog converters, filters, attenuators, amplifiers or the like, which are necessary for performing the analysis of the measurement signals. The analyzer may comprise, for example, a computer program that manages the analyzing process for determining the characteristic values. Accordingly, the analyzer may comprise a processor for performing the analyzing process defined by the computer program. In particular, the computer program may be stored in a memory of the analyzer.

BRIEF DESCRIPTION OF THE DRAWINGS

For a more complete understanding of the present invention and advantages thereof, reference is now made to the following description taken in conjunction with the accompanying drawings. The invention is explained in more detail below using exemplary embodiments which are specified in the schematic figures of the drawings, in which.

Figure 1:
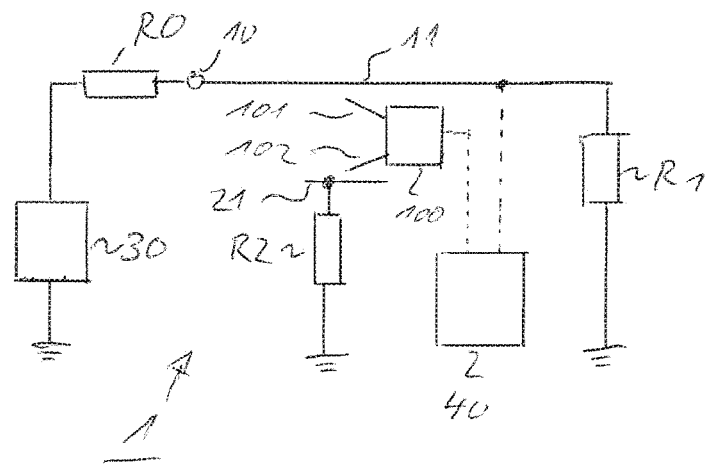
FIG. 1 shows a circuit diagram of an embodiment of a test arrangement according to the present invention.

The appended drawings are intended to provide further understanding of the embodiments of the invention. They illustrate embodiments and, in conjunction with the description, help to explain principles and concepts of the invention. Other embodiments and many of the advantages mentioned become apparent in view of the drawings. The elements in the drawings are not necessarily shown to scale.

In the drawings, like, functionally equivalent and identically operating elements, features and components are provided with like reference signs in each case, unless stated otherwise.

DETAILED DESCRIPTION OF THE DRAWINGS

FIG. 1 shows a circuit diagram of an embodiment of a test device 1 according to an embodiment. The test device 1 comprises a main signal line 11 and a symmetrical signal line 21. The main signal line 11 is terminated by a first impedance R1. The symmetrical signal line 21 is terminated by a second impedance R2. For terminating the main signal line 11, one end of the first impedance R1 is connected with an end of the main signal line 11, and the other end of the first impedance R1 is connected with a ground. Accordingly, one end of the second impedance R2 is connected with the symmetrical signal line 21, and the other end of the second impedance R2 is connected with the ground.

To provide a test signal to the test device 1, a test signal source 30 can be connected to the main signal line 11. For example, a first terminal 10 may be provided to the main signal line 11 for receiving the test signal from the test signal source 30. The first terminal 10 may be arranged at an end of the main signal line 11 which is opposite to the end connected to the first impedance R1.

The test signal source 30 may provide a test signal to the main signal line 11. In particular, the test signal source 30 may provide a ground reference test signal. Accordingly, the test signal source 30 may provide a test signal between a ground and a further output port of the test signal source 30.

Thus, the further output port of the test signal source 30 may be connected to the main signal line 11. Test signal source 30 may output a test signal with predetermined source impedance R0. Accordingly, the source impedance R0 of the test signal source 30 may be adapted to the impedance of the main signal line 11, in particular to the termination R1 of the main signal line 11. For example, the source impedance R0 may be the same impedance as the first impedance R1 for terminating the main signal line 11. In an embodiment, the first impedance R1 for terminating the main signal line 11 may be 50 Ohm. Accordingly, the source impedance R0 of the test signal source 30 may be also 50 Ohm. However, it is understood, that any other impedance value may be also used.

Since the main signal line 11 is connected to the ground by the first impedance R1 and the source impedance R0, the combination of these two impedances R0, R1 may be obtained based on a parallel arrangement of the two impedances R0, R1. For example, a reciprocal value of the combination of this parallel arrangement for the two impedances may be calculated to the sum of the individual reciprocal values of the first impedance R1 and the source impedance R0. Thus, the value of the impedance between the symmetrical signal line 21 and the ground may be set to a value which corresponds to the resulting impedance of the parallel source impedance and the first impedance R1. Accordingly, in the above-mentioned example when the first impedance R1 is 50 Ohm and the source impedance is also 50 Ohm, the second impedance R2 between the symmetrical signal line 21 and the ground may be set to 25 Ohm.

For analyzing a probe 100, a first terminal 101 of the probe 100 may be electrically coupled with the main signal line 11, and a second terminal 102 of the probe 100 may be electrically coupled with the symmetrical signal line 21. For example, the main signal line 11 and the symmetrical signal line 21 may comprise a contact segment, respectively. Accordingly, the first terminal 101 may be brought in contact with the first contact segment of the main signal line 11 and the second terminal 102 may be brought in contact with the contact segment of the symmetrical signal line 21. In this way, the probe 100 can measure a signal resulting by the difference between the main signal line 11 and the symmetrical signal line 21. By this arrangement, neither the first terminal 101 nor the second terminal 102 of the probe 100 is directly connected to the ground. Thus, probe 100 can measure a differential signal between the main signal line 11 and the symmetrical signal line 21 even though test signal source 30 provides a ground-based test signal.

The differential signal measured between the first terminal 101 and the second terminal 102 of the probe 100 can be provided to an analyzer 40 for analyzing the acquired test signal by probe 100. Further, analyzer 40 may also acquire a further measurement signal directly from the main signal line 11. In particular, analyzer 40 may measure the signal on the main signal line 11 in a configuration when no probe is connected the main signal line 11. In this configuration, analyzer 40 can acquire an undisturbed test signal.

After acquiring the undisturbed test signal in a configuration when no probe 100 is connected to the test device 1, and measuring further a differential signal between the main signal line 11 and the symmetrical signal line 21 by means of the probe 100, analyzer 40 can compare the two measured signals in order to determine characteristics of the probe 100.

For example, analyzer 40 may determine an impedance of the probe 100. Furthermore, it may be also possible that analyzer 40 may determine a frequency response or any other characteristic of the probe 100.

For determining the characteristics of the probe 100, analyzer 40 may not only acquire a single measurement value, but even a test sequence over a predetermined time period.

In particular, test signal source 30 may provide an appropriate test signal for determining the characteristics of the probe 100 over a predetermined frequency range. For example, test signal source 30 may provide a Dirac impulse. However, any other appropriate signal for a test sequence may be also provided by a test signal source 30. For example, test signal source 30 may provide a test sequence with increasing or decreasing frequency over a predetermined frequency range. Accordingly, analyzer 40 may measure the signal on the main signal line 11 directly, and additionally, analyzer 40 may acquire a differential signal between the first terminal 101 and the second terminal 102 of the probe 100. Thus, by comparing the two received signals, analyzer 40 can determine an impedance of probe 100, a frequency range of probe 100 or any other appropriate characteristic value of probe 100. In particular, the determined characteristics may be determined as a function depending on the frequency of the test signal and/or any other appropriate parameter.

Figure 2:
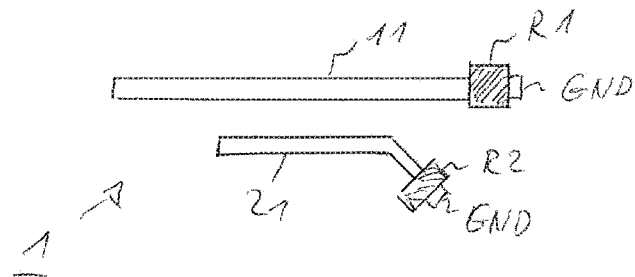
FIG. 2 shows a schematic diagram of configuration of an embodiment of a test arrangement according to the present invention.

FIG. 2 shows a conductive structure of a test device 1 according to the circuit illustrated in FIG. 1. As can be seen in FIG. 1, a first conductive element is provided as a main signal line 11. In particular, a test signal may be provided to the main signal line 11 by the first terminal 10. The first terminal 10 may be arranged on the first end of the main signal line 11. At the opposite, second end of the main signal line 11, a first impedance R1 may be arranged between the second end of the main signal line 11 and the ground GND. As already mentioned above, the first impedance R1 preferably may have a value corresponding to the source impedance R0.

Furthermore, a second conductive structure may be provided for the symmetrical signal line 21. As already mentioned above, a second impedance R2 may be arranged between the symmetrical signal line 21 and the ground. In case only a single impedance R2 is arranged between the symmetrical signal line 21 and the ground, the second impedance R2 may preferably have a value which corresponds to a value of the parallel arrangement of the source impedance R0 and the first impedance R1.

Accordingly, a first terminal 101 of the probe 100 may be brought in contact with the main signal line 11 and a second terminal 102 of the probe 100 may be brought in contact with the symmetrical signal line 21 for measuring a difference between the main signal line 11 and the symmetrical signal line 21.

Figure 3:
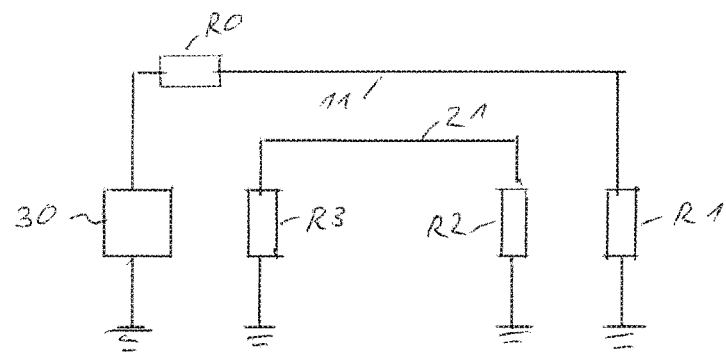
FIG. 3 shows a circuit diagram of another embodiment of a test arrangement according to the present invention.

FIG. 3 shows a circuit configuration of a test device 1 according to a further embodiment. The test device 1 according to this embodiment mainly corresponds to the previously described embodiment. Thus, the explanation provided before may be also valid for this embodiment. The embodiment according to FIG. 3 differs from the previously described embodiment by a symmetrical signal line 21 which is terminated on both ends by two impedances R2, R3. A first end of the symmetrical signal line 21 is terminated by the second impedance R2 and the other end of the symmetrical signal line 21 is terminated by a third impedance R3. In particular, a first end of the second impedance R2 is connected to the symmetrical signal line 21 and the other end of the second impedance R2 is connected to the ground. Accordingly, a first end of the third impedance R3 is electrically connected to the symmetrical signal line 21 and the other end of the third impedance R3 is electrically connected to the ground. Thus, there is also no direct connection between the symmetrical signal line 21 and the ground in this embodiment.

In particular, the value of the second impedance R2 may be the same as the value of the third impedance R3. Accordingly, there is a parallel configuration of the second impedance R2 and the third impedance R3. This parallel configuration of the second impedance R2 and the third impedance R3 may have a value corresponding to the value of the parallel configuration of the source impedance R0 and the first impedance R1. Accordingly, the value of the source impedance R0 and the values of the first impedance R1, the second impedance R2 and the third impedance R3 may be all the same. For example, all the four impedances may have a value of 50 Ohm. However, it is understood, that any other value may be also selected for the four impedances. In particular, all four impedances may have a same value.

Figure 4:
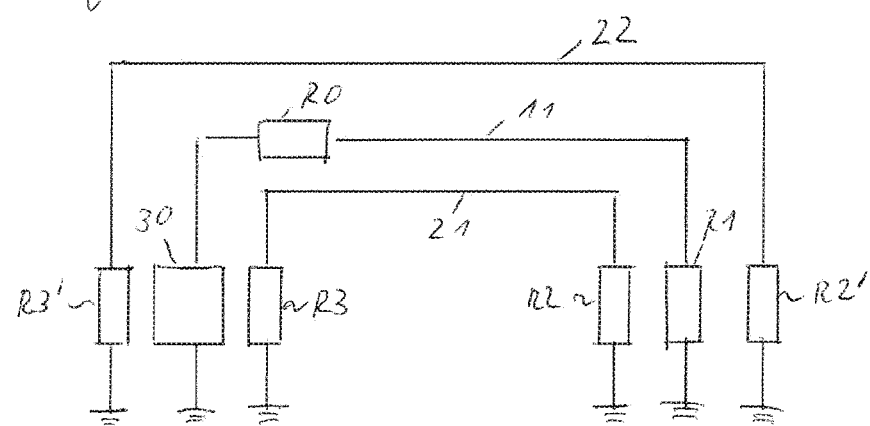
FIG. 4 shows a circuit diagram of an further embodiment of a test arrangement according to the present invention.

FIG. 4 shows a further circuit diagram of a test device 1 according to an embodiment. This embodiment mainly corresponds to the previously described embodiment in connection with FIG. 3. The embodiment according to FIG. 4 differs from the previously described embodiment by a further symmetrical signal line 22. Accordingly, the main signal line 11 is arranged between the two symmetrical signal lines 21, 22. As already described before, the symmetrical signal lines 21, 22 are terminated on both ends with appropriate impedances. In particular, the impedances R2' and R3' for terminating the second symmetrical signal line 22 may correspond to the impedances R2, R3 for terminating the first symmetrical signal line 21. However, it is understood that the first symmetrical line 21 and the second symmetrical line 22 may be also connected to the ground by a single impedance R2 as already described in connection with FIG. 1.

Figure 5:
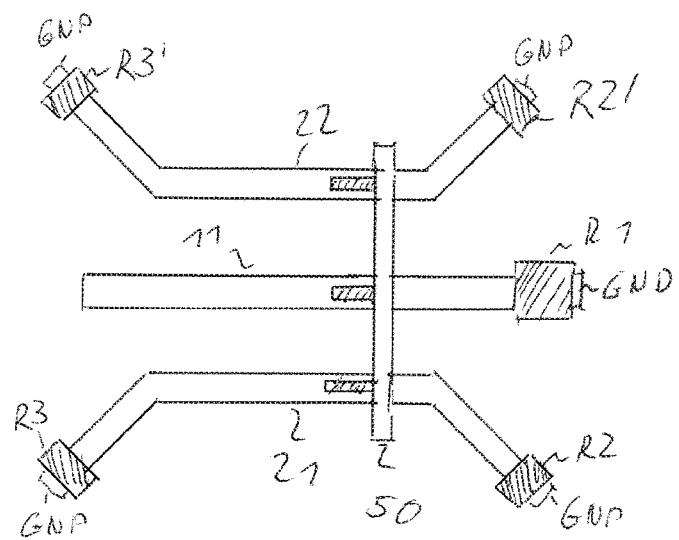
FIG. 5 shows a schematic diagram of configuration of another embodiment of a test arrangement according to the present invention.

FIG. 5 shows a top view of a configuration of a conductive structure for a test device 1 according to an embodiment. In line with the circuit diagram described in connection with FIG. 4, the main signal line 11 is arranged in between two symmetrical signal lines 21, 22. The main signal line 11 may be fed with a test signal by a first terminal 10 arranged at a first end of the main signal line 11. Accordingly, the opposite end of the main signal line 11 is terminated by a first impedance R1. Furthermore, a first end of the symmetrical signal lines 21, 22 is terminated by a second impedance R2, R2' and a second end of the symmetrical signal lines 21, 22 is terminated by a third impedance R3, R3'.

As can be further seen in FIG. 5, the test device 1 may comprise a fastening device 50. The fastening device 50 may be adapted to fasten the terminals 101, 102 of the probe 100 to the main signal line 11 and the symmetrical signal lines 21 or 22, 22. For example, fastening device 50 may comprise separate legs for fastening the terminals 101, 102 of the probe 100 to the main signal line 11 and the symmetrical signal line 21 or 22. In particular, the fastening device 50 may comprise one or more springs for pressing the terminals 101, 102 of the probe 100 to the main signal line 11 and the symmetrical signal lines 21, 22. In this way, a reliable contact between the terminals 101, 102 of the probe 100 and the main signal line 11 and the symmetrical signal lines 21, 22 can be achieved.

Figure 6:
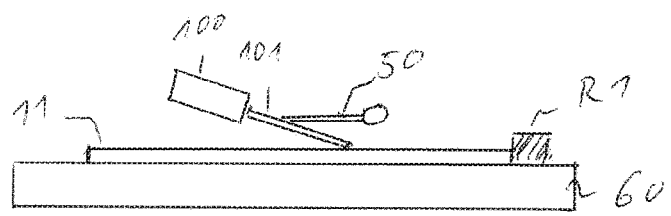
FIG. 6 shows a side view of an embodiment of a test arrangement according to the present invention.

FIG. 6 shows a cross section of a test device 1 according to an embodiment. As can be seen in FIG. 6, the conductive structure for the main signal line 11 and/or the symmetrical signal lines 21, 22 may be arranged on a dielectric support substrate 60. For example, the dielectric support substrate 60 may be a substrate of a printed circuit board or the like. Furthermore, any other appropriate substrate, for example a ceramic substrate or the like may be also possible. The conductive structure for the main signal line 11 and the symmetrical signal line 21, 22 may be formed, for example by means of a coplanar conductive structure which is arranged on the dielectric support substrate 60. For example, the conductive structure may be realized by a conductive material, in particular a metal like copper, gold, silver or the like. In particular, a material providing good electrically conducting properties may be used at the positions where the terminals 101, 102 of the probe 100 are connected to the main signal line 11 and the symmetrical signal line 21, 22. Thus, the probe 100 can acquire the test signals from the main signal line 11 and the symmetrical signal line 21, 22. Furthermore, an additional connector (not shown) may be provided for directly measuring the test signal on the main signal line 11. In this way, the test signal provided at the main signal line 11 may be provided to the analyzer 40. The additional connector by be arranged, for example, on the dielectric support substrate. However, it might be also possible, that the additional connector is connected to the fastening device, in particular to the legs of the fastening device 60.

Test device 1 may further comprise an appropriate conducive structure for distributing the ground signal. This conductive structure may be arranged on the same side as the main signal line 11 and the symmetrical signal line 21, 22. Additionally or alternatively, the conductive structure for the ground may by also arranged on a side of the dielectric support structure which is opposite of the side for carrying the main signal line 11 and the symmetrical signal line 21, 22.

Figure 7:
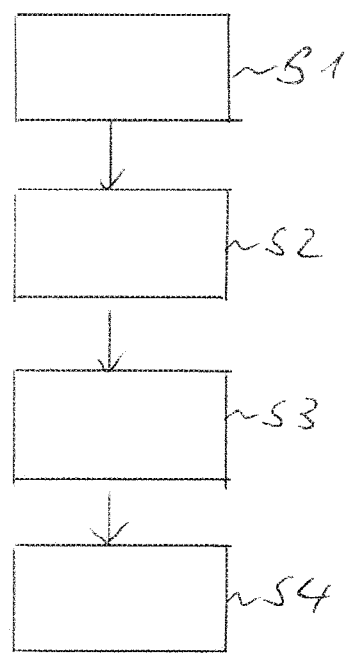
FIG. 7 shows a block diagram of an embodiment of a test method according to the present invention.

FIG. 7 shows a flow diagram of a test method for analyzing a probe 100 underlying an embodiment of the present invention. In a step S1 a ground referenced test signal is applied to the main signal line 11. The applied signal may be a ground referenced signal having a predetermined test impedance R0. As already mentioned above, the main signal line 11 may be terminated by first impedance R1.

In a step S2 a first measurement signal is measured. The first measurement signal may be directly measured on the main signal line 11.

In step S3 a second measurement signal is measured by the probe 100. In particular, a first terminal 101 of the probe is electrically connected to the main signal line 11, and a second terminal 102 of the probe is electrically connected to a symmetrical signal line 21. As already mentioned above, the symmetrical signal line 21 may be terminated by second impedance R2 or a combination of second and a third impedance R2, R3.

Steps S2 and S3 may be performed simultaneously, or subsequently.

In step S4 a characteristic value of the probe 100 is determined. The characteristic value may be determined based on the first measurement signal which is measured directly on the main signal line 11 and the second measurement signal which is acquired by means of the probe 100.

Summarizing, the present invention relates to a device and a method for analyzing a probe, in particular a symmetrical, differential probe. A ground-based test signal is provided to a main signal line, wherein the main signal line is terminated by a predetermined impedance. Furthermore, at least one additional signal line is provided, wherein a further impedance is arranged between the additional signal line and the ground. Accordingly, a differential probe may measure a differential signal between the main signal line and the additional signal line. Hence, no grounded signal is provided to the probe. This measurement of the probe can be compared with a reference signal directly acquired on the main signal line. In this way, characteristic values such as impedance and/or frequency response of the probe can be determined.

Although specific embodiments have been illustrated and described herein, it will be appreciated by those of ordinary skill in the art that a variety of alternate and/or equivalent implementations exist. It should be appreciated that the exemplary embodiment or exemplary embodiments are only examples, and are not intended to limit the scope, applicability, or configuration in any way. Rather, the foregoing summary and detailed description will provide those skilled in the art with a convenient road map for implementing at least one exemplary embodiment, it being understood that various changes may be made in the function and arrangement of elements described in an exemplary embodiment without departing from the scope as set forth in the appended claims and their legal equivalents. Generally, this application is intended to cover any adaptations or variations of the specific embodiments discussed herein.

In the foregoing detailed description, various features are grouped together in one or more examples or examples for the purpose of streamlining the disclosure. It is understood that the above description is intended to be illustrative, and not restrictive. It is intended to cover all alternatives, modifications and equivalents as may be included within the scope of the invention. Many other examples will be apparent to one skilled in the art upon reviewing the above specification.

Specific nomenclature used in the foregoing specification is used to provide a thorough understanding of the invention. However, it will be apparent to one skilled in the art in light of the specification provided herein that the specific details are not required in order to practice the invention.

Thus, the foregoing descriptions of specific embodiments of the present invention are presented for purposes of illustration and description. They are not intended to be exhaustive or to limit the invention to the precise forms disclosed; obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. Throughout the specification, the terms "including" and "in which" are used as the plain-English equivalents of the respective terms "comprising" and "wherein," respectively. Moreover, the terms "first," "second," and "third," etc., are used merely as labels, and are not intended to impose numerical requirements on or to establish a certain ranking of importance of their objects.

What we claim is:

1. A test device for analyzing a symmetric probe, the test device comprising:
    a main signal line connectable to a first terminal of the symmetric probe, the main signal line comprises a test signal source interface, electrically connected to a first end of the main signal line and adapted to receive a test signal, and a first impedance, adapted to terminate a second end of the main signal line;
    at least one symmetrical signal line, each symmetrical signal line being a further signal line connectable to a second terminal of the symmetric probe, each symmetrical signal line comprising a second impedance, adapted to terminate a first end of the respective symmetrical signal line; and
    a dielectric support substrate, wherein the main signal line and the at least one symmetrical signal line are electrically conductive structures arranged on the dielectric support substrate.

2. The test device of claim 1, further comprising a test signal source adapted to generate a ground referenced test signal and to provide the test signal to the main signal line.

3. The test device of claim 2, wherein the ground referenced test signal comprises a predetermined source impedance.

4. The test device of claim 3, wherein a value of the predetermined source impedance corresponds to a value of the first impedance.

5. The test device of claim 3, wherein a value of the second impedance corresponds to a value of an impedance of a parallel connection of the predetermined source impedance and the first impedance.

6. The test device of claim 1, wherein each symmetrical signal line further comprises a third impedance, adapted to terminate a second end of the respective symmetrical signal line.

7. The test device of claim 6, wherein a value of the second impedance corresponds to a value of the third impedance.

8. The test device of claim 1, comprising two symmetrical signal lines, arranged on opposite sides of the main signal line.

9. The test device of claim 1, comprising a fastening device adapted to fasten the symmetric probe to the test device.

10. The test device of claim 1, comprising a connector adapted to connect a measurement device to the main signal line and to at least one symmetrical signal line.

11. The test device of claim 1, wherein the main signal line and the at least one symmetrical signal line are arranged as coplanar conducting paths.

12. The test device of claim 1, comprising an analyzer adapted to receive a first measurement signal applied to the main signal line, to receive a second measurement signal measured by the symmetric probe, the symmetric probe being connected to the main signal line and at least one symmetrical signal line, and to determine a characteristic value of the symmetric probe based on the first measurement signal and the second measurement signal.

13. The test device of claim 12, wherein the characteristic value of the symmetric probe comprises at least one of an impedance of the symmetric probe or a frequency response of the symmetric probe.

14. A method for analyzing a symmetric probe, the method comprising:
    applying a ground referenced test signal with a predetermined test impedance to a main signal line, the main signal line being terminated by a first impedance, and the main signal line comprises an electrically conductive structure arranged on a dielectric support substrate;
    measuring a first measurement signal provided by a terminal electrically connected to the main signal line, and the at least one symmetrical signal line comprises an electrically conductive structure arranged on the dielectric support substrate;
    measuring, by the symmetric probe, a second measurement signal, wherein a first terminal of the symmetric probe is electrically connected to the main signal line and a second terminal of the symmetric probe is electrically connected to at least one symmetrical signal line terminated by a second impedance; and determining a characteristic value of the symmetric probe based on the first measurement signal and the second measurement signal.

* * * * *